US012307015B2

(12) United States Patent
Nussbaumer

(10) Patent No.: US 12,307,015 B2
(45) Date of Patent: May 20, 2025

(54) ACTUATOR UNIT

(71) Applicant: Next System Vertriebsges. mbH, Vienna (AT)

(72) Inventor: Michael Nussbaumer, Pitzenberg (AT)

(73) Assignee: Next System Vertriebsges. mbH, Vienna (AT)

( * ) Notice: Subject to any disclaimer, the term of this patent is extended or adjusted under 35 U.S.C. 154(b) by 0 days.

(21) Appl. No.: 18/044,486

(22) PCT Filed: Aug. 9, 2021

(86) PCT No.: PCT/EP2021/072182
§ 371 (c)(1),
(2) Date: Mar. 8, 2023

(87) PCT Pub. No.: WO2022/053240
PCT Pub. Date: Mar. 17, 2022

(65) Prior Publication Data
US 2023/0341940 A1    Oct. 26, 2023

(30) Foreign Application Priority Data
Sep. 8, 2020 (DE) .......................... 102020123436.8

(51) Int. Cl.
*G06F 3/01* (2006.01)
(52) U.S. Cl.
CPC .................................... *G06F 3/016* (2013.01)
(58) Field of Classification Search
CPC ............... G06F 3/016; G06F 3/03547; G06F 2203/04105; H03K 2217/96062; H03K 17/975
See application file for complete search history.

(56) References Cited

U.S. PATENT DOCUMENTS 6,894,507 B2 * 5/2005 Morimoto .......... G01R 27/2605
324/660
2012/0327025 A1 * 12/2012 Huska .................... H01H 13/85
345/174

(Continued)

FOREIGN PATENT DOCUMENTS

DE    102015010355 B3    7/2016
DE    102016002021 B3    7/2017

(Continued)

OTHER PUBLICATIONS

International Search Report for PCT Application No. PCT/EP2021/072182 dated Jan. 19, 2022. The International Bureau of WIPO.

(Continued)

*Primary Examiner* — Brent D Castiaux
(74) *Attorney, Agent, or Firm* — M&B IP Analysts, LLC

(57) ABSTRACT

The present disclosure relates to an actuator unit for generating haptic feedback on a human-machine interface. The actuator unit has a surface which can be moved in the Z-direction and a pressure-measuring apparatus for measuring pressure in the Z-direction. A feedback component is designed to transmit haptic feedback to the movable surface in reaction to pressure measured by the pressure-measuring apparatus. The actuator unit has contacting means for connecting the actuator unit to a control unit which is designed to receive and evaluate pressure measurement values and to activate the feedback component; at least two housing parts, wherein a first housing part forms the movable surface movable with respect to a second housing part at least in the Z-direction; wherein the pressure-measuring apparatus is a capativie measuring apparatus and is formed on the movable housing part and the feedback component is arranged between the two housing parts.

11 Claims, 5 Drawing Sheets

(56) References Cited

U.S. PATENT DOCUMENTS

| | | | | |
|---|---|---|---|---|
| 2018/0081483 A1* | 3/2018 | Camp | .................... | G06F 3/016 |
| 2018/0275810 A1* | 9/2018 | Khoshkava | ............. | G06F 3/016 |
| 2019/0391677 A1* | 12/2019 | Costante | ................ | G06F 3/016 |
| 2021/0365118 A1* | 11/2021 | Rajapurkar | ............. | G06F 3/016 |

FOREIGN PATENT DOCUMENTS

| | | | |
|---|---|---|---|
| DE | 102017107366 A1 | 1/2018 |
| DE | 102016122610 A1 | 5/2018 |
| DE | 102018101145 A1 | 7/2019 |
| DE | 102019109894 A1 | 10/2020 |
| FR | 3039671 A1 | 2/2017 |
| WO | 2019230634 A1 | 12/2019 |

OTHER PUBLICATIONS

Written Opinion of the Searching Authority for PCT Application No. PCT/EP2021/072182 dated Jan. 31, 2022. The International Bureau of WIPO.
"German Office Action for DE 10 2020 123 436.8" Dated May 5, 2021. Deutsches Patent-und Markenamt, Munich, Germany.

\* cited by examiner

ACTUATOR UNIT

The present disclosure relates to an actuator unit for generating a haptic feedback on a human-machine interface, according to the preamble of claim 1. The actuator unit has at least a surface that is movable in the Z direction, and a pressure-measuring means for measuring a pressure in the Z direction upon this movable surface. Also provided is a feedback component, which is designed to transmit a haptic feedback to the movable surface in response to a pressure measured by the pressure-measuring means. The actuator unit has contacting means for connecting a control unit that is designed to receive and evaluate pressure measurement values of the pressure-measuring means and to trigger the feedback component, via the contacting means, to generate a haptic feedback if a received pressure measurement value exceeds a limit value.

Such an actuator unit can be used in various fields of application to generate a haptic feedback on a surface of a human-machine interface when a certain pressure is applied to the surface. In particular, this can advantageously be used to generate for a user the perception of a mechanical pushbutton. The haptic feedback in this case may be generated by a feedback component in various ways, for example by use of piezoelectric, electromagnetic and/or electrostatic effects, to briefly move a surface from a neutral position into a deflected position. Various physical effects may also be used for the pressure measurement, for example with capacitive pressure measurement being used.

In particular, such a haptic feedback is provided in electronic devices, on a touchpad or a touchscreen. For this purpose, a complex layer structure composed of a plurality of functional layers is often provided beneath a touch-sensitive surface of an electronic device, as is disclosed, for example, in US 2019/0391677 A1. However, such a layer structure is firmly integrated into the electronic device and does not constitute a stand-alone, distinct component that can be placed, for example, at various positions under a display.

The object of the present disclosure is to provide an actuator unit of as compact a design as possible for generating a haptic feedback on a movable surface, which in particular can be used as a stand-alone component on a human-machine interface.

It is to be noted that the features listed individually in the claims can be combined with each other in any technically useful way, and indicate further designs of the disclosed embodiments. The description additionally characterizes and specifies the disclosed embodiments, in particular in conjunction with the figures.

The actuator unit according to the present disclosure is designed to generate a haptic feedback on a human-machine interface. For the purposes of the present disclosure, a haptic feedback is understood to be tactile feedback of force to a user who applies pressure to a surface by using the hand, a finger or a hand-operated implement. For the purposes of this disclosure, a human-machine interface is understood to be an interface via which a user can operate and/or control an electronic device. In particular in this case, a pressure- and/or touch-sensitive surface is used, via which a user can operate and/or control an electronic device by contact with the surface. This surface may also be referred to as a contact surface. The surface to be touched is, for example, a touch-sensitive surface of a touchpad or touchscreen. However, the present disclosure can also be applied to other types of human-machine interfaces where a haptic feedback is beneficial. Tactile feedback is usually effected by a short deflection of the surface touched by the user, in particular by a vibration.

The actuator unit has at least one surface that is movable in the Z direction, and a pressure-measuring means for measuring a pressure in the Z direction upon this movable surface. The Z direction substantially forms an angle of about 90° with the movable surface. Also provided is a feedback component, which is designed to transmit a haptic feedback to the movable surface in response to a pressure measured by the pressure-measuring means, i.e. to cause a brief movement/deflection of the first housing part from a neutral position into a deflected position. The feedback component in this case may cause the movable surface to be deflected once or several times. Suitable damper and return mechanisms cause a wanted oscillation behavior of the movable surface. For this purpose, the actuator unit has contacting means for connecting a control unit that is designed to receive and evaluate pressure measurement values of the pressure-measuring means and to trigger the feedback component to generate a haptic feedback if a received pressure measurement value exceeds a limit value.

The limit value may be a pressure value that is stored permanently in the control unit. In another embodiment, this limit value may be set on the control unit such that different limit values can be set, or a selection can be made between different limit values. Moreover, it is possible to define several limit values and to assign different haptic feedbacks to these limit values. For example, a different tactile feedback may be given to a user for a light pressure on a surface than for a higher pressure, and there may also be one or more intermediate levels.

According to the present disclosure, the actuator unit has at least two housing parts, wherein a first housing part realizes the movable surface in that the first housing part is arranged so as to be movable at least in the Z direction relative to a second housing part. The pressure-measuring means is then designed to measure a pressure in the Z direction upon the movable housing part. The feedback component is arranged between the two housing parts, and the pressure-measuring means is a capacitive measuring means, likewise arranged between the two housing parts, that is spatially separate from the feedback component, in order to effect a capacitive pressure measurement as a result of the movable first housing part being moved in the Z direction relative to the second housing part. For the purpose of moving the first housing part relative to the second housing part, the feedback component is supported on the second housing part. The deflection of a surface may in principle be effected in the Z direction, i.e. at an angle of 90° with respect to the movable surface, or laterally. In the case of the actuator unit according to the present disclosure, the deflection in the Z direction is effected by the feedback component pushing the first movable housing part away from the second housing part.

The actuator unit is preferably realized as a stand-alone component that can be built into an electronic device as a functional component. For example, it may be mounted beneath a surface of a touchpad or touchscreen, the first movable housing half of the actuator unit being mechanically connected to a touch-sensitive surface. In one embodiment of the present disclosure, a plurality of actuator units are mounted, for example there could be four actuator units, each respectively arranged in a corner of a surface. However, other suitable arrangements are also possible. When a user applies pressure to the surface, this pressure is transmitted to the first housing part, the movement of which in the direction of the second housing part results in a capacitive pressure measurement by the pressure-measuring means.

The pressure-measuring means generates an associated pressure measurement value, although the pressure measurement value does not necessarily have to be the absolute value of a pressure, but rather a pressure measurement value may also be given by another parameter that corresponds to the value of a certain pressure or a pressure change. At least this determined pressure value is transmitted to the control unit. If the determined pressure value exceeds a certain limit value, it is assumed by the control unit that it is not just a case of an unintentional touch by a user, but an intentional actuation pressure. Further parameters may be taken into account in this evaluation by the control unit. The control unit, via the contacting means of the actuator unit, thereupon triggers the feedback component, which excites the first housing half of the actuator unit to provide a haptic feedback by a brief movement, or vibration. This excitation is transmitted to the surface of the human-machine interface connected to the first half of the housing. The position of the surface can be altered translationally, by being tilted about an axis and/or the surface being deformed locally, for example by bending. The surface is mounted accordingly and the actuator unit according to the present disclosure can be used flexibly depending on the installation situation.

The structure of an actuator unit according to the present disclosure has the advantage that a housing for a compact component can be formed by the two housing parts. The housing parts are preferably composed of an electrically non-conductive plastic, and the essential functional components of the actuator unit can be arranged between them. In this case, the first movable housing part closes the actuator unit on one side, but also serves to transmit an external pressure to the capacitive pressure-measuring means and also to transmit a haptic feedback to a surface connected thereto. For installation, the second housing part can be fixedly connected to parts of an electronic device that are themselves immovable.

The capacitive pressure-measuring means in this case is likewise arranged between the two housing parts, but spatially separate from the feedback component, i.e. they do not overlap, for example. This has the advantage, in particular, that both components can be assembled easily and separately from each other. In one embodiment of the present disclosure, the pressure-measuring means and the feedback component are located next to each other as viewed in the Z direction. Both components can then be positioned, for example, next to each other on the second housing part before the first housing part is put on to close the actuator unit. Both housing parts are preferably shaped so as to form a unit that is almost closed toward the outside and that is easily handled without, for example, individual parts unwantedly changing position.

Overall, therefore, the disclosed embodiments provides an easily assembled, compact actuator unit that can be used in various fields of application. The actuator unit can be realized in a flat form, for example with low heights of up to 3 mm, which is advantageous for use in flat display devices. However, greater heights may also be realized.

The feedback component may be designed in various ways on the basis of different physical effects to briefly cause the first housing half to move or even oscillate. For example, the feedback component comprises a piezo structure or oscillator coil, each of which is designed to cause the first housing part to move in the Z direction. In the case of a piezo structure, due to the piezo effect the application of a voltage causes a mechanical force that is transmitted to the first housing part and used to create a haptic effect. In the case of an oscillator coil (plunger coil, voice coil), tactile stimuli are transmitted by electromagnetic force.

In one embodiment of the present disclosure, the actuator unit itself comprises a return mechanism, which is designed to return the first housing part to its neutral position following a deflection from its neutral position into a deflected position. The return mechanism thus counteracts the deflection of the first housing part from the neutral position into the deflected position. For this purpose, the return mechanism has, for example, at least one spring element, which is clamped under tension between the first housing part and the second housing part. This integration of a return mechanism into a compact actuator unit has the advantage that the return is less dependent on the conditions of the installation situation of the actuator unit. In an alternative embodiment, the at least one spring element is not tensioned between the two housing parts of the actuator unit, but between the movable first housing part and a part of a human-machine interface in which the actuator unit is installed. In any case, the spring element pulls the first housing part toward the second housing part.

In a further alternative embodiment, on the other hand, it is provided that the actuator unit is installed in such a way that an external return mechanism acts upon the two housing parts. For example, external spring elements may exert a pressure upon the first housing part, and optionally also on the second housing part, in order to return the first housing part in the direction of the second housing part following a deflection by the feedback component.

In a preferred embodiment of the present disclosure, there is also at least one damping element arranged between the feedback component and the second housing part in order to influence, and thereby improve, the vibration behavior of the system. The damping element is, for example, a rubber component. For example, the damping element is at least partially received in a receiver within the second housing part. The receiver is in particular a depression in the second housing part that matches the shape and size of the damping element. This facilitates assembling of the actuator unit according to the present disclosure, since the damping element can be inserted into the receiver before the feedback component is mounted, while the damping element is held in position there and in particular cannot slip sideways. The damping element in this case projects beyond the opening edge of the receiver and in this region contacts the underside of the feedback component.

However, the position of the damping element may also be fixed to the second housing part in another manner.

In a preferred embodiment of the present disclosure, the capacitive pressure-measuring means has at least one first electrode and one second electrode. The first electrode is mechanically connected to the first movable housing part, while the second electrode is mechanically connected to the second housing part. Between the two electrodes there is at least one layer of a dielectric, which dielectric may be realized in various ways. In one embodiment of the present disclosure, the pressure-measuring means is realized such that the distance between the two electrodes is reduced when pressure is applied to the first housing part, as a result of which a changing capacitance can be measured in order to determine a pressure measurement value therefrom. In alternative embodiments, a structure with appropriate force reversals is selected in order to increase the distance between the two electrodes when pressure is applied to the first housing part and to determine a pressure measurement value from a changing capacitance. The deformation of an electrode and/or a parallel shifting of the two electrodes relative to each other may also be used for determination of pressure. However, two parallel electrodes that are moved toward each other when a force acts upon the electrode on the movable housing part have the advantage that they can be easily attached to the inner sides of the two housing parts.

In one embodiment of the present disclosure, the feedback component, in addition to generating a haptic feedback, is also designed to measure a pressure upon the first housing part in the Z direction. When pressure is applied to the first movable housing part, this presses on the feedback component, which can measure this pressure. If, for example, a piezo structure is used, the piezo structure undergoes mechanical compression, which can be detected as a change in voltage and converted into a pressure measurement value. The feedback component is then not only used to generate a haptic feedback, but it can optionally also be used to measure pressure. In the case of a piezo structure, both the direct piezoelectric effect and the inverse piezoelectric effect are used. When pressure is applied to the first movable housing part, the first housing part thus presses on the feedback component and simultaneously moves the first electrode in the direction of the second electrode of the capacitive pressure-measuring means, in order thus to reduce the distance between the electrodes for a capacitive pressure measurement (or to increase the distance, to deform an electrode, to shift electrodes relative to each other).

The pressure measurement of a feedback component such as a piezo structure is dynamic, whereas the pressure measurement of the capacitive pressure-measuring means is quasi-static. In the case of capacitive pressure measurement, a position of the electrodes relative to each other results in a certain pressure measurement value that does not change as long as the position of the housing parts/electrodes relative to each other does not change. This can be described as static. The pressure measurement values determined by both components are suitably processed by the control unit so as to increase the accuracy of the pressure measurement. In one embodiment of the present disclosure, the control unit is therefore designed to determine a reference pressure value, for comparison with the limit value, from pressure measurement values of the capacitive pressure-measuring means and pressure measurement values of the feedback component.

Preferably, the functioning of the actuator unit can be configured via the control unit, in which case it can be configured whether or not the feedback component is additionally used for pressure determination. The pressure measurement by the feedback component is therefore only to be regarded as optional, but the actuator unit is designed for this option.

In order to provide an actuator unit that is of the simplest possible design and that is also easy to assemble, the feedback component and the pressure-measuring means are preferably electrically contacted to the control unit via a common contacting element. This contacting element serves at least for triggering of the feedback component by the control unit and for connecting the capacitive pressure-measuring means to the control unit. In addition, it may also serve to connect the feedback component in order to transmit pressure measurement values from the feedback component to the control unit. In an advantageous embodiment of the present disclosure, the contacting element used comprises a flat strip of an electrically insulating material, on which there are applied a plurality of contact lines for electrically contacting the feedback component and the pressure-measuring means. The strip-type contacting element can then be electrically connected to the feedback component and the pressure-measuring means via connection points.

In one embodiment of the present disclosure, it is provided that the contacting element also realizes the at least two electrodes of the capacitive pressure-measuring means. The electrodes are thus realized on the contacting element and are brought into the correct position during assembling of the contacting element. Preferably, the at least one layer of a dielectric between the two electrodes is then formed by the flat strip of the contacting element. The strip-type contacting element thus not only provides the electrical contacting for the actuator unit, but also simultaneously realizes the essential components of the capacitive pressure-measuring means. This again facilitates the assembling of the actuator unit and contributes to its compactness.

The two electrodes in this case may be realized and positioned on the contacting element in different ways. For example, the flat strip of the contacting element realizes two pressure portions, on each of which an electrode is realized. For example, an electrode is formed by a copper layer applied to the flat strip. By deforming the flat strip, it is then possible to position the two pressure portions with the electrodes relative to each other in such a way that they lie parallel to each other in two planes, with at least one layer of the flat strip being located between the two electrodes. Preferably, at least two layers of flat strip are located between the two electrodes and form a dielectric.

In one embodiment of the present disclosure, the flat strip of the contacting element is configured, for example by means of through-holes and/or incisions, in such a way that it has at least one tab strip that is folded over at a bending point, wherein realized at the ends of the at least one tab strip there is a respective pressure portion on which a flat electrode is attached in such a way that the two pressure portions of flat strip are located between the two electrodes. In particular, two such tab strips may be provided, which are folded over at a bending point. Thus, during production of the contacting element, two pressure portions are realized, on which electrodes are realized. The electrodes in this case are initially located on the same side of the flat strip. The two pressure portions are connected to each other via at least one tab strip. If the at least one tab strip is folded over at a bending point, the two pressure portions come to lie parallel to each other, with one of the two electrodes now being located on the opposite side of the contacting element. The two pressure portions are now located between the two electrodes.

In this way, the contacting element can be produced easily, requiring contact lines and electrodes to be applied to only one side of a flat strip. By folding over the at least one tab strip, the two electrodes are brought into the correct position relative to each other, and the contacting element can be assembled. For this purpose, for example, a pressure portion, with an electrode, is first connected to a housing part, and when the other housing part is mounted this is connected to the other pressure portion, and thus to the other electrode. This may be effected, for example, by means of an adhesive connection. The use of such a contacting element also has the advantage that the capacitive pressure-measuring means and the contacting of the feedback component can be arranged in a simple means approximately in one plane, thereby facilitating the low structural height of the actuator unit according to the present disclosure.

In one embodiment of the present disclosure, the two housing parts are stepped in the region of the electrodes, i.e. of the capacitive pressure-measuring means. This allows the electrodes to be positioned in a different plane than the feedback component as viewed in the Z direction. The bending point of the at least one tab strip of a contacting element is flexible and yielding, such that the first electrode can move relative to the second electrode without the bending point breaking under continuous load.

In order to make the production of the contacting element and the realization of the pressure portions with the electrodes as simple as possible, it is further provided, for example, that the flat strip has a recess within which the at least one folded-over tab strip is arranged, wherein contact lines of the contacting element are routed around the recess to the feedback component and the electrodes of the pressure-measuring means. The flat strip of the contacting element then optionally widens in the region of this recess.

The present disclosure also includes a human-machine interface having a surface to which at least one actuator unit according to the disclosed embodiments is interfaced in order to generate a haptic feedback when pressure is applied to the surface and to transmit it to the surface. The human-machine interface comprises the control unit, which is connected to one or more actuator units via the respective contacting means. The control unit can be configured for the respective application. For example, one or more pressure limit values can be set in the control unit.

Further advantages, special features and expedient developments of the disclosed embodiments will be apparent from the dependent claims and the following representation of preferred embodiments, with reference to the illustrations.

Of the illustrations:

Figure 6A:
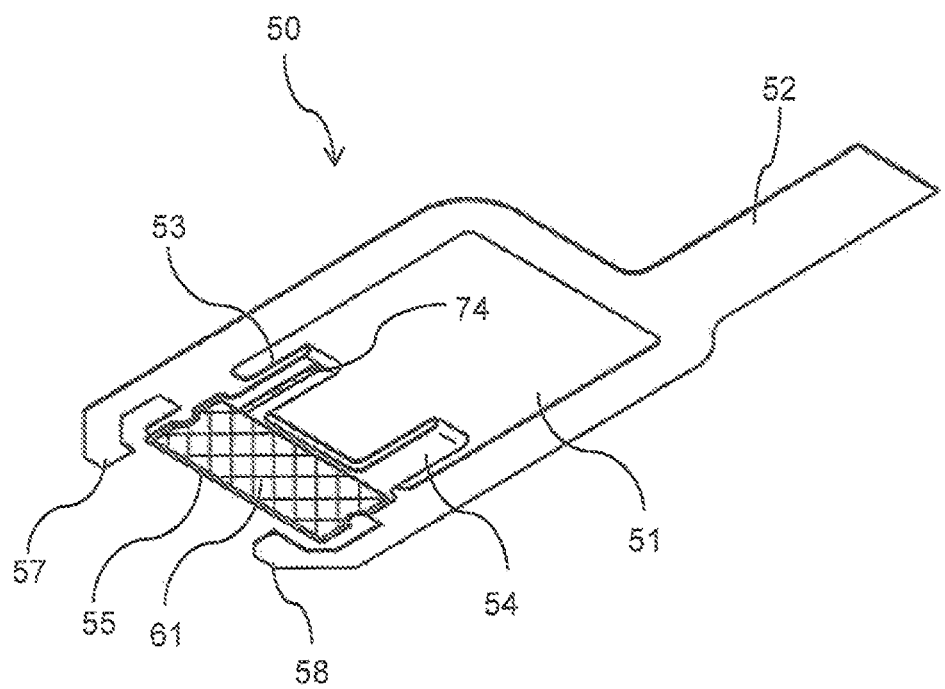
FIG. 6A shows a three-dimensional plan view of a contacting element according to FIG. 5A in the folded state.
Figure 6B:
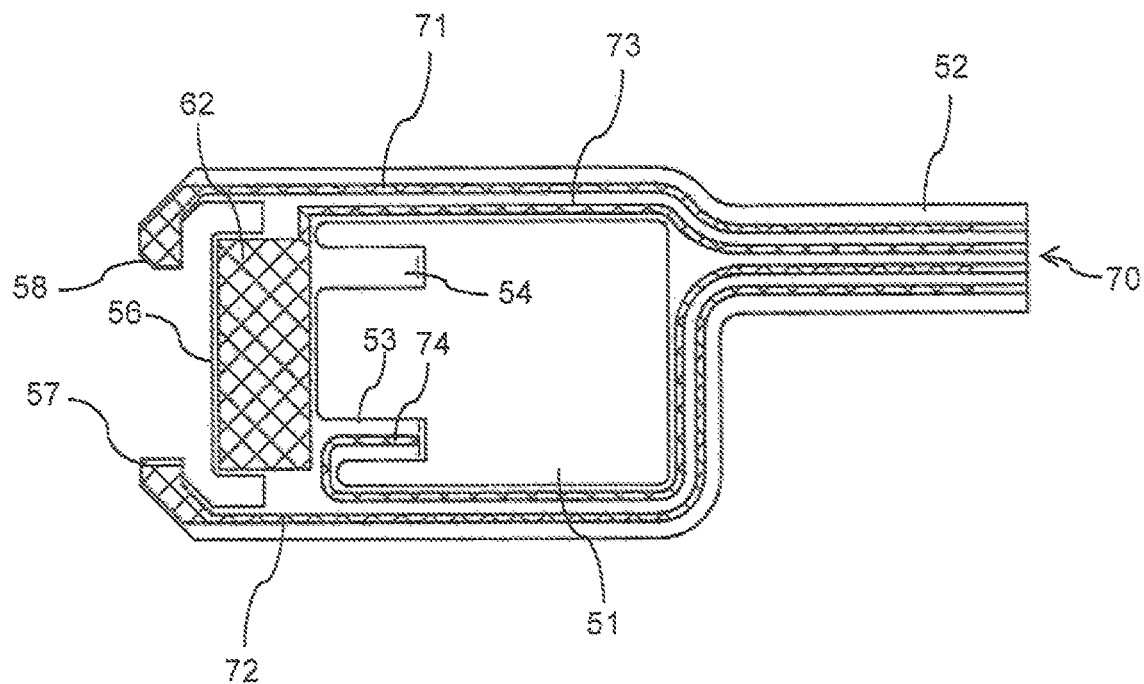

FIG. 6B a rear view of the contacting element according to FIG. 6A.

Figure 1:
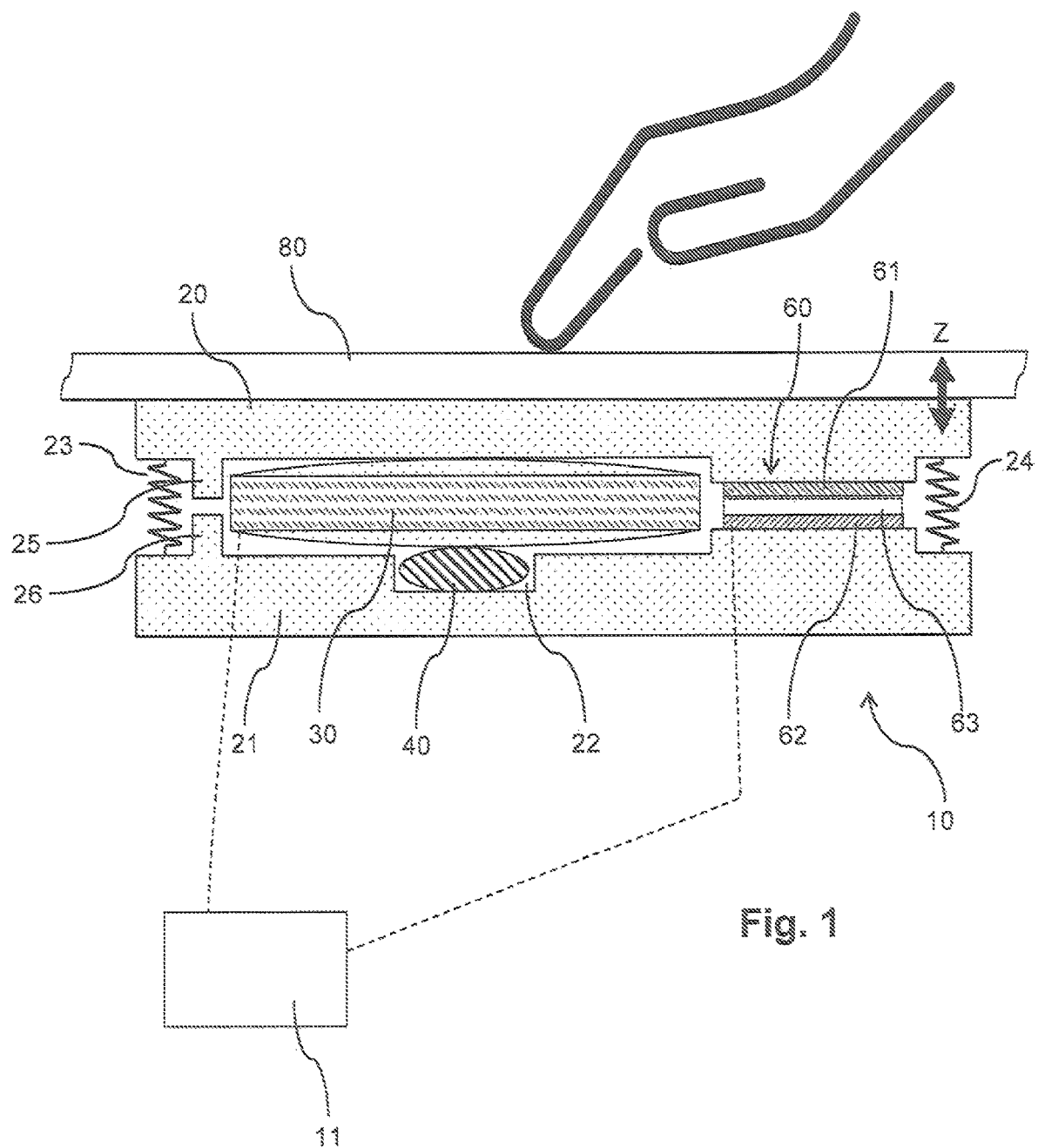
FIG. 1 shows a schematic sectional representation of a first embodiment of the actuator unit according to the embodiment.

FIG. 1 shows a schematic sectional representation of a first embodiment of an actuator unit 10 according to the embodiment for generating a haptic feedback on a human-machine interface. The essential components and their functions will be explained on the basis of this representation of principle. The interface is not represented in its entirety in the figures, but only the actuator unit 10 and a surface 80 of the human-machine interface. The surface 80 is a pressure- and/or touch-sensitive surface. Further, the upper side of the surface 80 is flat as in the embodiments of the figures. However, it may also have other shapes, for example a curved shape. The interface is formed, for example, by a touchpad or a touchscreen. The actuator unit 10 is triggered via a control unit 11 of the human-machine interface, the connector of which is represented schematically by a dashed line in the figures. Furthermore, the human-machine interface may have one or more actuator units.

The embodiment of FIG. 1 provides two housing parts 20 and 21, which together form a housing of the actuator unit 10, in which the essential components of the actuator unit 10 are received. This includes a feedback component 30, which in this embodiment is a piezo structure. Alternatively, an oscillator coil (voice coil) could also be selected, for example. The first housing part 20 is also referred to as the upper housing part and is movable in the Z direction relative to a second housing part 21, which consequently forms a lower housing part. When installed, the lower housing part 21 is then fixed, while the upper housing part 21 constitutes the movable side. The possible movement of the upper housing part 20 is represented in FIG. 1 by a double arrow. The upper housing part 20 in this case can be guided with respect to the lower housing part 21. For the purpose of explaining the principle, in this embodiment the surface 80 is directly interfaced with the upper housing part 20, but the mechanical interfacing may also be implemented differently and comprise, for example, further intermediate elements, carriers, suspensions, etc. This is the case with the embodiment of FIG. 2 and the intermediate element 81, although this is again only a representation of principle. The intermediate element may also be realized in other ways.

The feedback component 30 is received between the two housing parts 20, 21, there being a damping element 40 located between the feedback component 30 and the lower housing part 21. This damping element 40 is received in a recess 22 in the lower housing part 21 and projects beyond the opening edge of the recess to make contact there with the underside of the feedback component 30. On the upper side, the feedback component 30 bears against an inner surface of the upper housing part 20.

There is also a capacitive pressure-measuring means 60 realized between the two housing parts 20, 21. As viewed in the Z direction, this pressure-measuring means 60 is located next to the feedback component 30, i.e. it is spatially separate from it. The pressure-measuring means 60 comprises two flat electrodes 61, 62 and a dielectric 63 located between them. A first electrode 61 is connected to the first housing part 20, while a second electrode 62 is connected to the lower housing part 21.

If a pressure is applied to the surface 80 in the Z direction (represented by a hand, not to scale), this pressure is transmitted to the upper housing part 20, causing this housing part 20 to move in the direction of the lower housing part 21. This movement is optionally limited by a stop 25, 26. The distance between the two electrodes 61, 62 of the capacitive pressure-measuring means 60 is reduced, and from the measured capacitance, or its change, the connected control unit 11 can determine a pressure measurement value. If this pressure measurement value is greater than a certain limit value, the pressure upon the surface 80 is interpreted as the intended operating pressure of a user. The control unit 11 then triggers the feedback component 30 to generate a haptic feedback on the upper housing part 20. This haptic feedback is transmitted from the upper housing half 20 to the surface 80.

For the purpose of generating the haptic feedback, for example a voltage is applied to the piezo structure 30, which voltage is converted by the inverse piezoelectric effect into a mechanical force that expands the piezo structure 30, thereby pushing the upper housing part 20 away from the lower housing part 21. Thus, the upper housing part 20 moves from a neutral position into a deflected position. This is effected against the force of one or more tensioning components 23, 24. The latter are, for example, in the form of spring elements that are clamped under tension between the two housing parts 20 and 21. The tensioning components act as a return mechanism that returns the upper housing part 20 to its neutral position after it has been deflected. Together with the damping element 40, this results in an oscillation system that is suitably selected so as to produce on the surface 80 the desired perception for the user, by means of an appropriate excitation by the feedback component.

Figure 2:
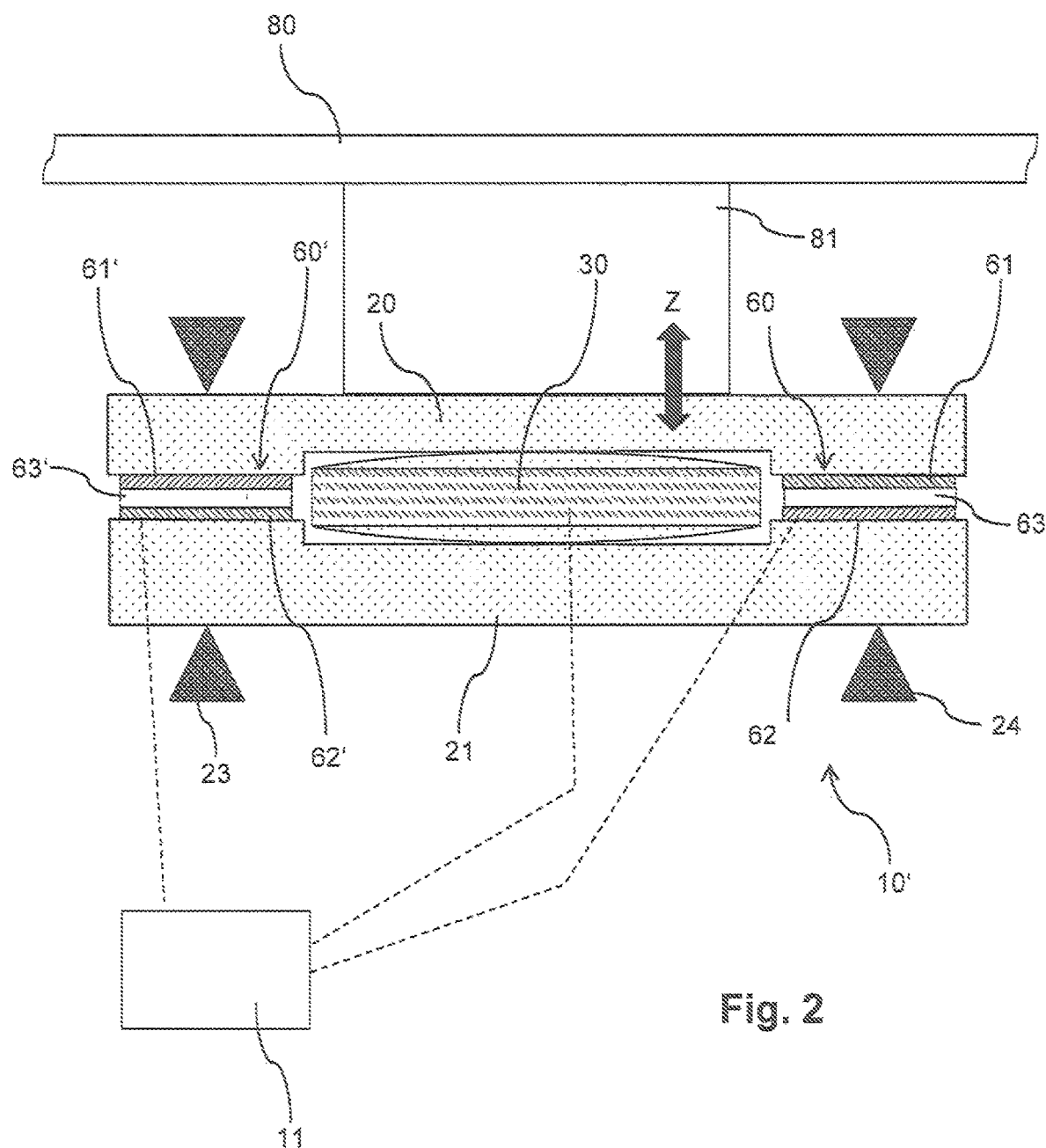
FIG. 2 shows a schematic sectional representation of a second embodiment of an actuator unit according to the embodiment.

FIG. 2 shows a schematic sectional representation of a second embodiment of an actuator unit 10', which in significant features corresponds to the embodiment of FIG. 1. However, two pressure-measuring means 60 and 60' are provided, which are arranged on opposite sides of the feedback component 30. Both pressure-measuring means 60 60' have two electrodes 61, 62 and 61', 62' respectively, located between which there is a dielectric 63, 63'. In a further alternative embodiment, the electrodes are annular and surround the feedback component 30. In such an embodiment, too, the pressure-measuring means is to be regarded as spatially separate from the feedback component 30, since the annular electrodes do not overlap with the feedback component 30 in the Z direction.

Moreover, it is not spring elements, clamped between the two housing parts 20, 21, that are provided as tensioning ends 23, 24. Rather, tensioning elements 23, 24 act on the two housing parts 20, 21 from the outside as a result of the actuator unit 10' being installed in an electronic device, and thus cause the upper housing part 20 to return to its neutral position.

In the case of the embodiments of FIGS. 1 and 2, it may further be provided that the respective feedback component 30 is likewise used for pressure measurement in addition to the at least one capacitive pressure-measuring means 60, 60'. If pressure is applied to the surface 80, and thus to the upper housing part 20, the feedback component 30 also is subjected to a mechanical force in the Z direction that compresses the feedback component 30. This is converted by the direct piezoelectric effect into a voltage from which a pressure measurement value can be determined. The control unit 11 is then designed to evaluate the pressure measurement values from the feedback component 30 and from the at least one capacitive pressure-measuring means 60, 60' in order to improve the pressure determination overall.

The embodiments of FIGS. 1 and 2 illustrate that the actuator unit according to the embodiment can be realized as a compact component in which a feedback component and also at least one capacitive pressure-measuring means can be accommodated in a simple manner in a housing composed of two housing parts. The individual functional components can be aligned on the lower housing part 21 before the upper housing part 20 is mounted. Suitable contacting of the feedback component and of the pressure-measuring means to the control unit 11 can also facilitate compactness and simplicity of mounting. Advantageous contacting is explained with reference to FIGS. 3 and 4.

Figure 3:
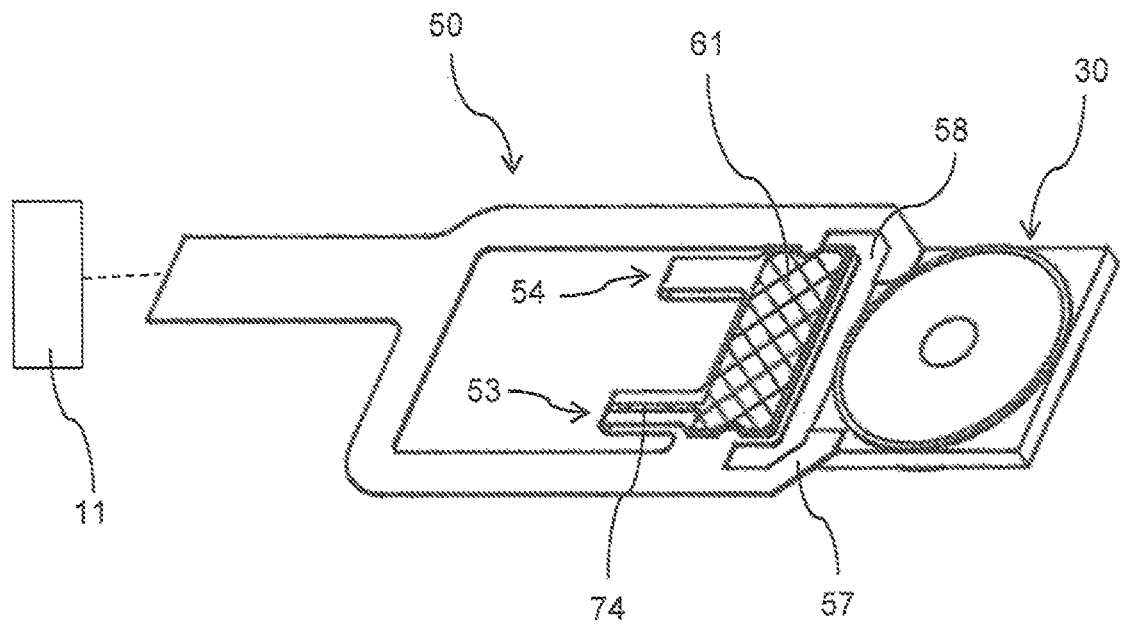
FIG. 3 shows a three-dimensional view of an embodiment of a contacting of an actuator unit by means of a strip-type contacting element.
Figure 4:
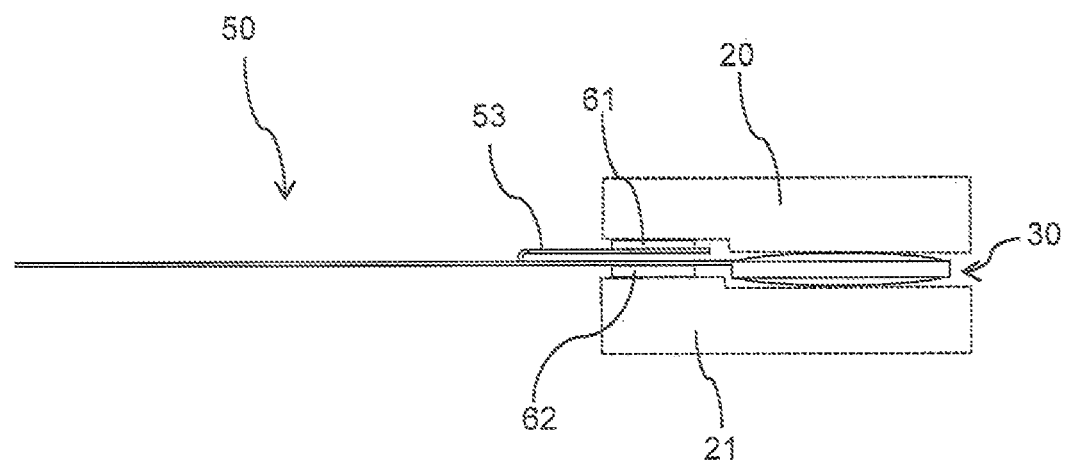
FIG. 4 shows a schematic longitudinal section through a contacting according to FIG. 3.

FIG. 3 shows the contacting of a feedback component 30 in the form of a piezo structure. FIG. 4 shows a schematic longitudinal section through this contacting. The piezo structure 30 is electrically connected to the control unit 11 to enable it to be triggered and also, optionally, enable pressure signals to be received from it. This contacting is effected via a special contacting element 50 that simultaneously realizes the electrodes of at least one capacitive pressure-measuring means. The assembly of FIG. 1 may be effected before or after the feedback component 30 is attached to a lower housing part 21.

The contacting element 50 is formed by a flat strip of an electrically non-conductive material, on which there are applied contact lines for contacting the feedback component and the capacitive pressure-measuring means. Copper, for example, is selected for these contact lines. At the same time, the flat strip realizes at least two pressure portions, on each of which a flat electrode is applied. These electrodes may also be made of copper. The flat strip is deformed in such a way that the two flat electrodes lie parallel to each other in two planes, with the pressure portions, made of the material of the flat strip, being located between the two electrodes and thus forming a dielectric.

In the representation of FIG. 3, the contact lines are not visible, being on the underside of the contacting element 50, which is connected to the control unit 11 by means of these contact lines. Contact lines lead to two end-side contact tabs 57 and 58 on the flat strip, which are connected to the piezo structure 30. Further contact lines lead to the two electrodes, of which the upper electrode 61 is visible in the view of FIG. 3. This electrode 61 is located at the end of two tab strips 53, 54 that are folded over in their center. On one tab strip 53, a conductor 74 is routed from the underside of the flat strip, around the bending point of the tab strip 53, to the electrode 61. The other electrode 62, likewise contacted via a conductor, is shown in FIG. 4, on the underside of the contacting element 50.

The two electrodes 61, 62 are arranged in such a way that, when an actuator unit is assembled, they are located between the two housing parts. The connection to the housing parts may be effected, for example, by an adhesive bond. In FIG. 4, the two housing halves 20, 21 are represented schematically by dashed lines.

Figure 5A:
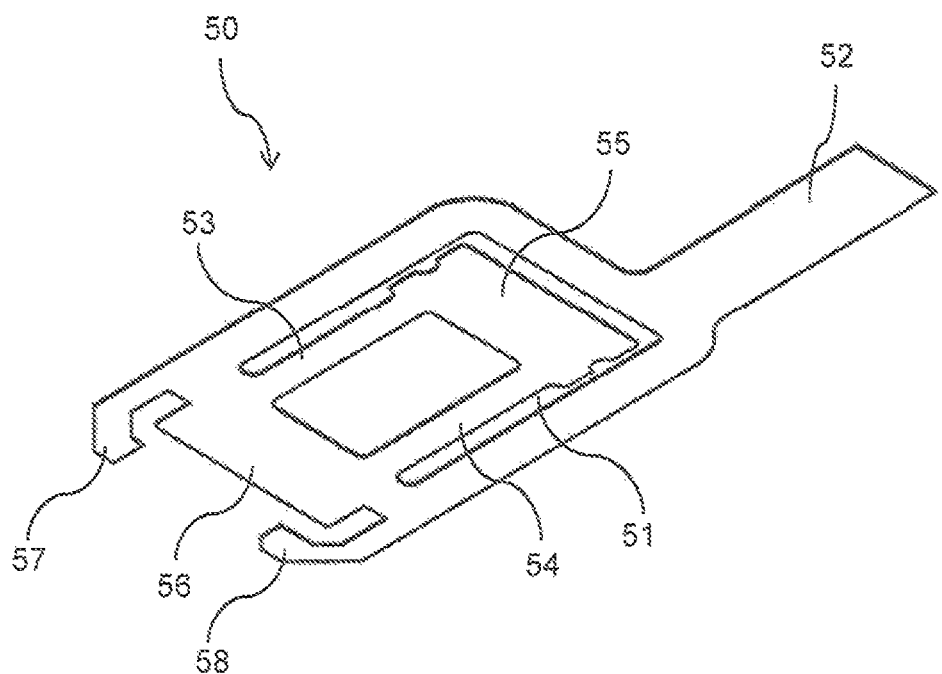
FIG. 5A shows a three-dimensional plan view of a contacting element according to FIG. 3 in the folded-out state.
Figure 5B:
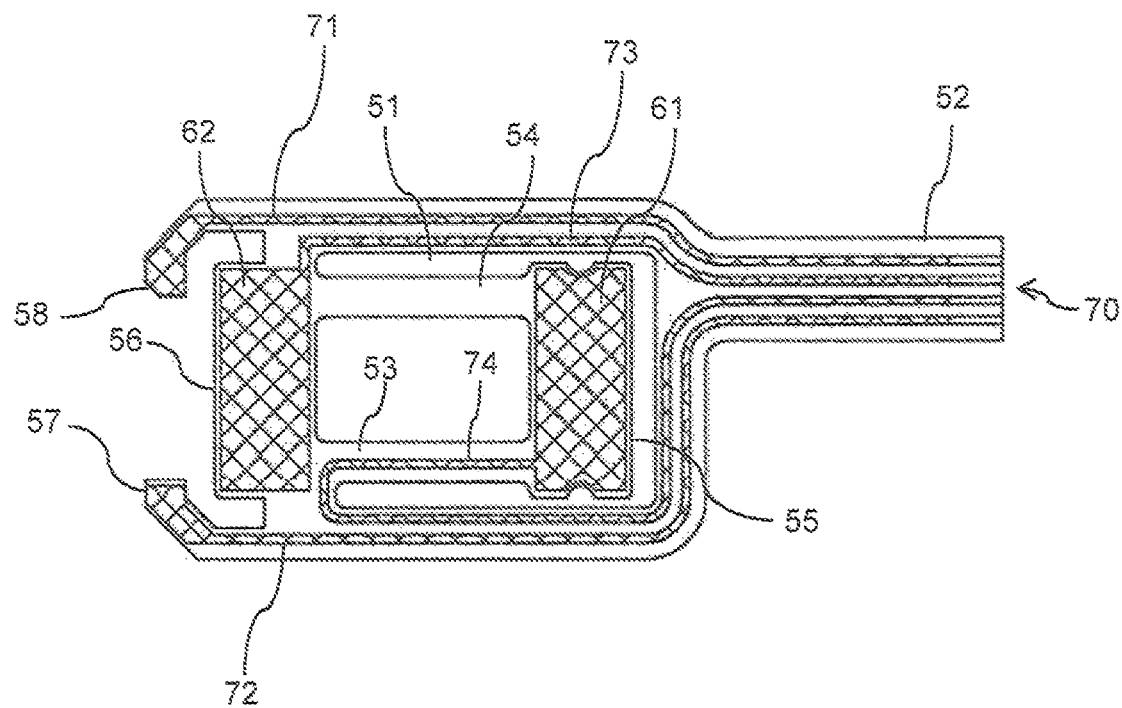
FIG. 5B shows a rear view of the contacting element according to FIG. 5A.

The contacting element 50 is created in two steps. First, contact lines and electrodes are realized on one side of the flat strip. Then, at least one tab strip is folded over at a bending point to bring the two electrodes into a position parallel to each other. This production process is explained in more detail with reference to FIGS. 5A, 5B and 6A, 6B. FIGS. 5A and 5B show the contacting element 50 in the first production stage, with FIG. 5A showing the upper side and FIG. 5B showing the underside. The flat strip of the contacting element 50 realizes a feeder portion 52 on which all contact leads 70 are routed. It also realized a recess 51 around which these contact leads 70 are routed, at least partially. At least two conductors 71 and 72 are routed around the recess 51 to two contact tabs 57, 58 in the strip, to which the feedback component is contacted.

In addition, between the two contact tabs 57, 58 the strip realizes a first pressure portion 56, from which two tab strips 53, 54 project into the recess 51. Realized at the other end of these tab strips 53, 54 there is a further pressure portion 55 that connects the two tab strips 53, 54 to one another. Realized on the first pressure portion 56 there is first electrode 62, which is contacted by means of a conductor 73 that likewise is routed around the recess 51. Realized on the second pressure portion 55 there is a second electrode 61, which is contacted via a conductor 74 that is routed over the tab strip 53 to the electrode 61.

In order to form the final contacting element, the tab strips 53, 54 are folded over by approximately 180° at a bending point. This is effected in such a way that the two electrodes 61, 62 then lie substantially parallel over one another. FIG. 6A shows the result of this second production step from the upper side, while FIG. 6B again shows the resulting contacting element from the rear side. The electrode 61 is now on top and is contacted, around the bend of tab strip 53, by conductor 74, while the other electrode 62 and the remaining contact lines 70 are on the opposite side of the flat strip. The two pressure portions 55 and 56 are located between the two electrodes 61, 62 and form a dielectric.

The invention claimed is:

1. An actuator unit (10;10') for generating a haptic feedback on a human-machine interface, having at least:
   - a surface that is movable at least in part in a Z direction, the Z direction being substantially normal to the surface;
   - a pressure-measuring means (60) arranged between at least two housing parts (20;21), wherein the pressure measuring means is adapted to measure a pressure in the Z direction upon this movable surface, the pressure-measuring means (60) having at least two flat electrodes (61, 62);
   - a feedback component (30) arranged between the at least two housing parts (20;21), wherein the feedback component is designed to transmit a haptic feedback to the movable surface in response to a pressure measured by the pressure-measuring means (60) and wherein the feedback component (30) is adapted to cause a first housing part (20) of the at least two housing parts (20;21) to move at least in part in the Z direction;
   - contacting means adapted to connect the actuator unit (10;10') to a control unit (11) that is designed to receive and evaluate pressure measurement values of the pressure-measuring means (60) and to trigger the feedback component (30) to generate a haptic feedback if a determined pressure measurement value exceeds a limit value; and
   - a return mechanism, which is designed to return the first housing part (20) to its neutral position following a deflection from its neutral position into a deflected position; and wherein
   - the actuator unit (10;10') has the at least two housing parts (20;21), wherein the first housing part (20) realizes the movable surface in that the first housing part (20) is arranged so as to be movable at least in the Z direction relative to a second housing part (21) of the at least two housing parts (20;21);
   - the pressure-measuring means (60) is designed to measure a pressure in the Z direction upon the housing part (20);
   - the pressure-measuring means (60) is a capacitive measuring means that is spatially separate from the feedback component (30), in order to effect a capacitive pressure measurement as a result of the first housing part (20) being moved in the Z direction relative to the second housing part (21); and
   - the actuator unit (10;10') is realized as a stand-alone component that can be built into an electronic device as a functional component and the two housing parts (20;21) form a housing for said stand-alone component;
   - for a purpose of moving the first housing part (20) relative to the second housing part (21), the feedback component (30) is supported on the second housing part (21);
   - a flat strip of a contacting element (50) is configured, by means of through-holes and/or incisions, in such a way that it has at least one tab strip (53;54) that is folded onto one another at a bending point, wherein realized at ends of the at least one tab strip (53;54) there is a respective pressure portion (55;56) on which a one of the flat electrodes (61;62) is attached in such a way that the two pressure portions (55;56) are located between the flat electrodes (61;62);
   - the feedback component (30) and the pressure-measuring means (60) can be electrically contacted to the control unit (11) via the common contacting element (50), wherein the flat strip is an electrically insulating material on which there is applied a plurality of contact lines (70) for electrically contacting the feedback component (30) and the pressure-measuring means (60);
   - the flat strip has a recess (51) within which the at least one tab strip (53;54) is arranged, wherein contact lines (70) of the contacting element (50) are routed around the recess (51) to the feedback component (30) and the flat electrodes (61;62) of the pressure-measuring means (60); and
   - the return mechanism has at least one spring element, which is clamped under tension between the first housing part (20) and the second housing part (21).

2. The actuator unit as claimed in claim 1, characterized in that the feedback component (30) comprises at least one of the group consisting of: a piezo structure and an oscillator coil, which is adapted to cause the motion of the first housing part (20) in the Z direction.

3. The actuator unit as claimed in claim 1, characterized in that it comprises a return mechanism, which is designed to return the first housing part (20) to its neutral position following a deflection from its neutral position into a deflected position.

4. The actuator unit as claimed in claim 1, characterized in that there is at least one damping element (40) arranged between the feedback component (30) and the second housing part (21).

5. The actuator unit as claimed in claim 4, characterized in that the damping element (40) is at least partially received in a receiver (22) within the second housing part (21).

6. The actuator unit as claimed in claim 1, characterized in that at least one first flat electrode (61) of the at least two flat electrodes (61, 62), is connected to the first housing part (20), and at least one second flat electrode (62) of the at least two flat electrodes (61, 62), which is connected to the second housing part (21), and wherein there is at least one layer of a dielectric between the at least one first flat electrode and the at least one second flat electrode (61;62).

7. The actuator unit as claimed in claim 1, characterized in that the feedback component (30), in addition to generating a haptic feedback, is also designed to measure a pressure upon the first housing part (20) in the Z direction.

8. The actuator unit as claimed in claim 7, characterized in that the control unit (11) is designed to determine a reference pressure value, for comparison with the limit value, from pressure measurement values of the capacitive pressure-measuring means (60) and pressure measurement values of the feedback component (30).

9. The actuator unit as claimed in claim 1, characterized in that the contacting element (50) realizes the at least two flat electrodes (61;62) of the pressure-measuring means (60), and wherein at least one layer of a dielectric between the two flat electrodes (61;62) is formed by the flat strip of the contacting element (50).

10. The actuator unit as claimed in claim 1, characterized in that the pressure-measuring means (60) and the feedback component (30) are arranged next to each other as viewed in the Z direction.

11. The actuator unit as claimed in claim 1, characterized in that the at least one tab strip (53;54) comprises at least two tab strips (53;54) and wherein one of the contact lines (70) for electrically contacting a first one of the electrodes (61;62) of the pressure-measuring means (60) is routed over one of the two tab strips (53;54) while the another of the contact lines (70) for a second one of the electrodes (61;62) is routed around the recess (51).

\* \* \* \* \*